United States Patent [19]

Oppelt et al.

[11] Patent Number: 5,128,615
[45] Date of Patent: Jul. 7, 1992

[54] RESONATOR FOR A MAGNETIC RESONANCE IMAGING APPARATUS

[75] Inventors: Ralph Oppelt, Weiher; Wilhelm Duerr, Erlangen; Horst Siebold, Erlangen, all of Fed. Rep. of Germany

[73] Assignee: Siemens Aktiengesellschaft, Berlin and Munich, Fed. Rep. of Germany

[21] Appl. No.: 623,210

[22] Filed: Dec. 6, 1990

[30] Foreign Application Priority Data

Dec. 12, 1989 [EP] European Pat. Off. ........ 89122972.6

[51] Int. Cl.[5] ........................................... G01R 33/20
[52] U.S. Cl. ...................................... 324/322; 343/743
[58] Field of Search ....................... 324/322, 318, 309; 343/743, 741; 333/219, 235

[56] References Cited

U.S. PATENT DOCUMENTS

| | | | |
|---|---|---|---|
| 4,065,121 | 11/1991 | Ghadaksaz | 333/235 |
| 4,694,255 | 9/1987 | Hayes | 324/318 |
| 4,746,866 | 5/1988 | Roschmann | 324/318 |
| 4,757,290 | 7/1988 | Keren | 324/318 |
| 4,766,383 | 8/1988 | Fox et al. | 324/318 |
| 5,057,778 | 10/1991 | Rath | 324/322 |

FOREIGN PATENT DOCUMENTS

| | | |
|---|---|---|
| 0161782 | 11/1985 | European Pat. Off. . |
| 0304249 | 2/1989 | European Pat. Off. . |
| 44-18965 | 11/1965 | Japan .................... 343/743 |
| 0008754 | 1/1977 | Japan .................... 343/743 |

OTHER PUBLICATIONS

"Parallel-Plate Split-Conductor Surface Coil: Analysis and Design," Gonord et al. Mag. Res. in Med., vol. 6, No. 3 (1988) pp. 353–358.

"Resonator Coils for Magnetic Resonance Imaging at 6 MHz," Samaratunga et al., Medical Physics, vol. 15, No. 2 (Mar./Apr. 1988) pp. 235–240.

"Quadrature Detection Coils-A Further $\sqrt{2}$ Improvement in Sensitivity," Chen et al. J. Mag. Res. vol. 54 (1983) pp. 324–327.

"Quadrature Detection Surface Coil," Hyde et al. Mag. Res. in Med., vol. 4 (1987) pp. 179–184.

Primary Examiner—Michael J. Tokar
Assistant Examiner—Raymond Mah
Attorney, Agent, or Firm—Hill, Van Santen, Steadman & Simpson

[57] ABSTRACT

A resonator for use in a magnetic resonance imaging apparatus for transmitting and receiving high frequency signals is formed by a combination of two antenna sub-systems, which generate respective magnetic fields which are perpendicular to each other, with the currents in the sub-system being phase-shifted by 90° relative to each other, and each sub-system includes a capacitance which defines the resonant frequency. Each of the sub-systems forms a current loop, the current loops containing a common current network and a common base plate, which serves as a return path for both current loops. The junctions of the current network are connected via the resonant capacitances to the base plate, which consists of electrically conductive material. A circularly polarizing resonator is achieved for the transversal, fundamental field of the imaging apparatus, with the resonator also being capable of use as a surface resonator if the spacing between the current network and the base plate is small.

4 Claims, 2 Drawing Sheets

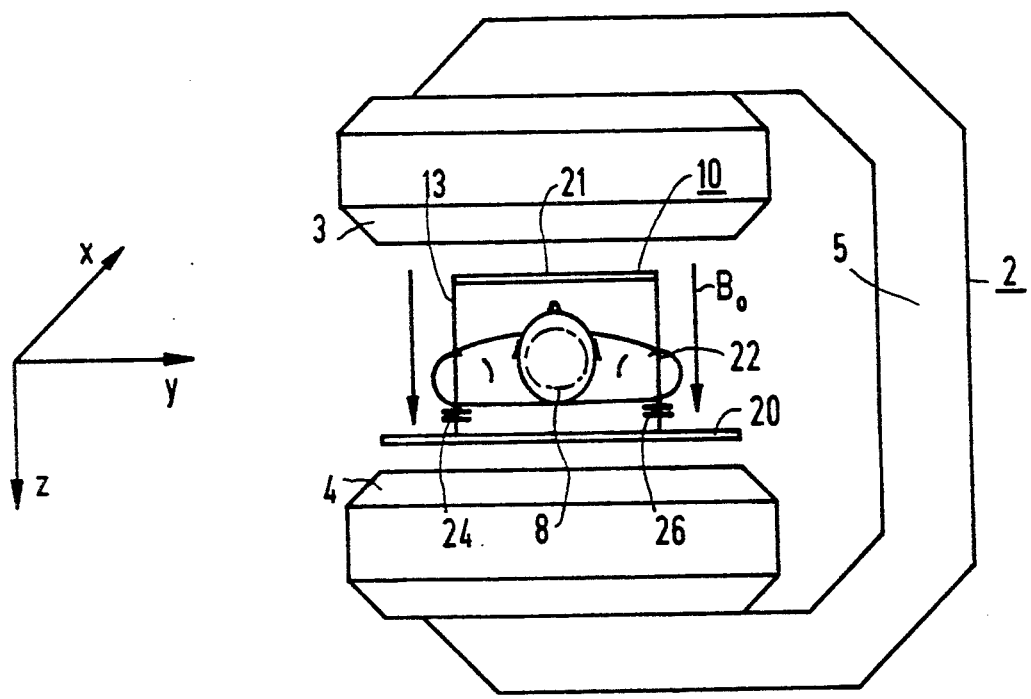

RESONATOR FOR A MAGNETIC RESONANCE IMAGING APPARATUS

BACKGROUND OF THE INVENTION

1. Field of the Invention

The present invention is directed to a resonator suitable for use in a magnetic resonance imaging apparatus (MRI or nuclear magnetic resonance (NMR) for diagnostic examination of an examination subject, such as a human body.

2. Description of the Prior Art

In a magnetic resonance imaging apparatus which is used for medical diagnostics of a human body, the body axis is usually oriented along the x-axis of a rectangular coordinate system. The body region to be examined is situated between the pole pieces of a magnet which generates a fundamental magnetic field extending in the direction of the z-axis. A resonator is provided for transmitting the excitation signals and receiving the resonance signals. It is known to construct such a resonator as a combination of two sub-systems, which are respectively connected to a transmitter and a receiver via a network which serves the purpose of frequency tuning, load matching and balancing and via a common 90°/3 dB directional coupler.

In addition to obtaining tomograms of an examination subject, magnetic resonance imaging can be used to undertake diagnostics of joints and to portray blood vessels. An image is constructed by computational or mensurational analysis of integral proton resonance signals from the spatial spin density, or analysis of the distribution of relaxation times, of the examination subject. The examination subject is introduced into a uniform magnetic field, referred to as the fundamental field, which aligns the nuclear spins in the body. Gradient coils are provided which generate spatially different magnetic fields. A RF antenna excites the nuclear spins, and receives the measured signals induced by the excited nuclear spins, which are forwarded to a receiver. This RF antenna is generally connected to a transmitter and a receiver via a network having matching capacitances, as well as via a transmission and reception diplexer. The maximum pulse transmission power is established by the load limit of these components, whereas the maximum means transmission power is essentially limited by the extent to which localized heating of the examination subject can be safely tolerated.

As is known, a low transmission power requires circularly polarizing antennas. Such antennas have the advantage of generating only the field components which are effective for the nuclear magnetic resonance, for example counter-clockwise field components. Such an antenna, for example, may be formed by two linearly polarizing antenna systems arranged orthogonally relative to each other, and connected to a transmitter and to a receiver via a 90° directional coupler. The supplied transmission signal is divided between the two systems with a 90° phase shift, and generates the rotational field which is effective for the nuclear magnetic tomography. In the reception mode, the antenna represents two useful signal sources phase-shifted by 90°, and also represents two uncorrelated noise sources. The 90° directional coupler supplies the receiver with the in-phase sum of the useful signals. Such an antenna system is described in the article "Quadrature Detection Coils-A further √2 improvement in Sensitivity," Chen et al., Journal of Magnetic Resonance, Vol. 54, (1983) pp. 324–327.

Antenna systems known as surface resonators are also known which can be used for obtaining an image of certain body regions having relatively small extent. Such known surface resonators are flat ("pancake") coils having one or more turns. Such surface resonators are simply placed on the body part for which an image is to be obtained, for example, on a spinal vertebra, the middle ear, or an eye.

A known, circularly polarizing surface resonator for magnetic resonance imaging of a human body, whose body axis extends in the direction of the fundamental magnetic field, consists of two nested sub-systems. One of the sub-systems, known as a planar pair resonator, contains two annular-cylindrical coil turns formed by ribbon conductors. These coil turns are connected to each other via other ribbon conductors. The two coil turns are arranged side-by-side in the x-z plane. The second sub-system is known as a CRC (counter rotating current) resonator, and also contains two annular-cylindrical coil turns which are arranged above each other co-axially relative to the y-axis and parallel to the x-z plane. The planar pair resonator is disposed in the space between the two coils of the CRC resonator. An intrinsic decoupling from uniform, external high frequency fields is obtained with this resonator. This embodiment has two differently constructed and arranged sub-systems, however, and is therefore suitable only for use with an apparatus wherein the fundamental magnetic field proceeds in the direction of the body axis, and moreover is relatively complicated. A system of this type is described in the article "Quadrature Detection Surface Coil," Hyde et al., Magnetic Resonance in Medicine, Vol. 4 (1987), pp. 179–184.

Known fundamental field magnets are generally superconductive for stronger magnetic fields above 0.5 T, and are generally in the form of solenoids, which generate a static fundamental field proceeding in the direction of the body axis of the patient. Other fundamental field magnets are also known for magnetic resonance imaging wherein the fundamental field extends perpendicular to the body axis of the examination subject, i.e., in the direction of the z-axis of a rectangular coordinate system. The magnet for generating such a fundamental magnetic field has pole pieces which define an imaging region, and between which the uniform fundamental field is generated. The pole pieces may be connected to each other via the yoke of a permanent magnet or of an electromagnet, and may form a C-magnet or H-magnet having two yokes, as described in European application 0,161,782. The fundamental magnetic field generated by such magnets is known as a transversal fundamental field.

SUMMARY OF THE INVENTION

It is an object of the present invention to provide a resonator for a magnetic resonance imaging tomography apparatus having a transversal fundamental magnetic field wherein the high frequency magnetic field vector components of the resonator lie substantially only in slice planes perpendicular to the fundamental magnetic field, for exciting nuclear spins in the region of the examination subject for which an image is to be obtained.

The object is achieved in accordance with the principles of the present invention in a resonator formed by a combination of two sub-systems which are spatially oriented at least 90° relative to each other, and which respectively carry resonant currents which are chronologically phase-shifted by 90°, and which generate respective magnetic fields substantially perpendicular to each other in the examination subject. Each sub-system contains at least one resonance capacitance. Each sub-system forms a current loop provided with a current network having junctions connected via the resonant capacitances to a base plate consisting of electrically conductive material. The base plate forms a common return path for the current loops of the two sub-systems. The current network of the two current loops is formed by conductors which are shared by both sub-systems.

The resonator constructed in accordance with the principles of the present invention is a circularly polarizing resonator which is suitable both for transmission and reception of the high-frequency signals which are encountered in magnetic resonance imaging. The resonator is preferably employed as a head coil.

In a further embodiment of the invention, the resonator is constructed substantially flat, with a relatively small spacing between the base plate and the current network. This flat embodiment can be used as a surface resonator.

In a further embodiment, the individual conductors may respectively contain a resonance capacitance. In a further embodiment, a conductor section of the power loops has a cover plate of electrically conductive material.

DESCRIPTION OF THE DRAWINGS

FIG. 1 is an end elevational view of a magnetic resonance imaging apparatus with a resonator constructed in accordance with the principles of the present invention.

FIG. 2 is a perspective view of a resonator constructed in accordance with the principles of the present invention in a first embodiment.

DESCRIPTION OF THE PREFERRED EMBODIMENTS

Figure 3:
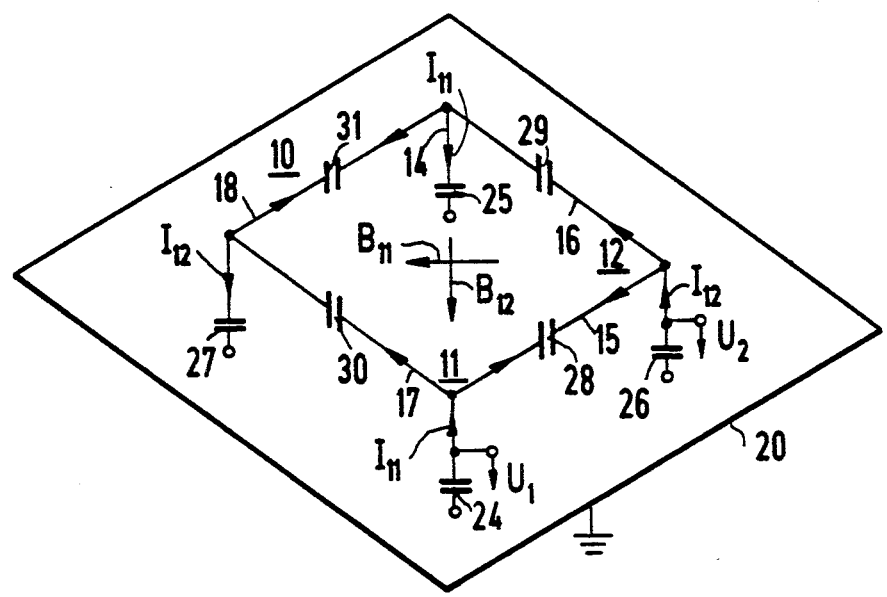
FIG. 3 is a perspective view of a resonator constructed in accordance with the principles of the present invention in a further embodiment.

In the embodiment of a magnetic resonance imaging apparatus shown in FIG. 1, the resonator constructed in accordance with the principles of the present invention is generally shown at 10. The apparatus includes a magnet 2, for example a C-magnet, which generates a static, fundamental magnetic field $B_0$ proceeding parallel to the z-axis of a rectangular coordinate system having x, y and z axes. The tomography apparatus may be used, for example, for undertaking diagnostic examinations of parts of a human body, whose body axis extends along the x-axis of the coordinate system. A region 8 to be examined is indicated with dashed lines in FIG. 1. The examination region 8 is disposed between the poles pieces 3 and 4 of the magnet 2. In this embodiment of the magnet 2, at least the poles surfaces of the poles pieces 3 and 4 which face each other, as well as the yoke 5, are provided with a shielding (not shown) of electrically conductive material for the high frequency field. Such a shielding generally consists of copper.

The origin of the coordinate system lies in the region 8 in the center of the circularly polarizing resonator 10, between the pole pieces 3 and 4. The coordinate system is shown next to the apparatus in FIG. 1 only for clarity.

The resonator 10 generates magnetic fields $B_{11}$ and $B_{12}$ (see FIG. 2). The magnetic field $B_{11}$ proceeds approximately parallel to the x-y plane in the region 8. For example, the region 8 may be situated in the head of a patient inside the resonator 10. Further details of the structure of the resonator 10 are described below; the resonator 10 shown in FIG. 1 is schematically indicated as having a cover plate 21, two connecting conductors 13 and 22 containing respective resonant capacitances 24 and 26, and a common base plate 20.

In the embodiment of a resonator constructed in accordance with the principles of the present invention shown in FIG. 2, one antenna sub-system 11 is formed by a line network formed by pairs of discrete conductors, such as a pair formed by conductors 15 and 16 and a pair formed by conductors 17 and 18. The conductor pairs are connected at junctions 32 and 33. The junction 32 is connected to a base plate 20 which serves as a return line or path, via a connecting conductor 13 having a resonance capacitance 24. The junction 33 is connected to the base plate 20 via a connecting conductor 14 having a resonance capacitance 25.

A further sub-system 12 constructed in a similar manner shares the network of conductor pairs 15 and 16, and 17 and 18. In the sub-system 12, the pairs are joined at junctions 34 and 35. The junction 34 is connected to the base plate 20 via a connecting conductor 22 which has a resonance capacitance 26, and the junction 35 is connected to the base plate 20 via a connecting conductor 23 which contains a resonance capacitance 27.

The energy coupling to the resonator may take place, for example, at the resonance capacitances 24 and 26, as indicated in FIG. 2 by arrows indicating voltages $U_1$ and $U_2$.

In a resonator suitable for examination of a patient's head, the connecting conductors 13, 14, 22 and 23 may have a height H above the base plate 20 of, for example, 25 through 30 cm. The length L of the discrete conductors 15 through 18 will then be approximately 30 cm. A resonant current $I_{11}$ in the sub-system 11 is divided at the junction 32 of the line network, so that respective sub-currents $I_{11}/2$ flow in the discrete conductors 15 and 16, as well as in the conductors 17 and 18. The current $I_{11}$ returns via the connecting conductor 14 and the base plate 20, and the resonant capacitances 24 and 25.

In a similar manner, a resonant current $I_{12}$ in the sub-system 12, generated with 90° phase shift, is divided at the junction 34 into sub-currents $I_{12}/2$ respectively flowing in the discrete conductors 16 and 18, and 15 and 17. This current returns via the junction 35 and the connecting conductor 23 and via the resonance capacitors 26 and 27 and the base plate 20.

In the imaging volume between the discrete conductors 15 through 18 and the base plate 20, the resonant currents $I_{11}$ and $I_{12}$ form the magnetic field $B_{11}$ and $B_{12}$, which are disposed perpendicularly relative to each other, as indicated in FIG. 2 with arrows. The magnitude of the resonance capacitances 24 through 27 is selected so that the frequency of a desired resonant mode with the resonant currents $I_{11}$ and $I_{12}$ superimposed on each other is identical to the operating frequency of the magnetic resonance imaging apparatus.

In the embodiment of the resonator 10 shown in FIG. 2, wherein the current networks form an approximately square winding, the sub-systems 11 and 12 are rotated by an angle of 90° relative to each other. The discrete conductors 15 through 18, however, may form an approximately rectangular winding, in which case the rotational angle will be other than 90°.

Further resonance capacitances can be arranged in the discrete conductors 15 through 18, in addition to the resonance capacitance 24 through 27. This is shown in the embodiment of FIG. 3, wherein one such additional capacitance has been disposed in each conductor 15 through 18. These additional resonance capacitances are referenced 28, 29, 30 and 31 in FIG. 3. As a result of the resonant currents which are divided approximately in half and which flow in the respective conductor pairs 15 and 16, and 17 and 18, and return via the connecting conductors 14 and the resonance capacitances 24 and 25 and the base plate 20, magnetic fields $B_{11}$ and $B_{12}$ are generated, which are again indicated by the vector arrows in FIG. 3. The embodiment of FIG. 3 has the advantage of a decoupling of the sub-systems 11 and 12 which is possible in a simple manner by balancing one of the resonance capacitances 28 through 31, even if the discrete conductors 15 through 18 do not form a square structure, but instead form, for example, a rectangular or oval structure.

Figure 4:
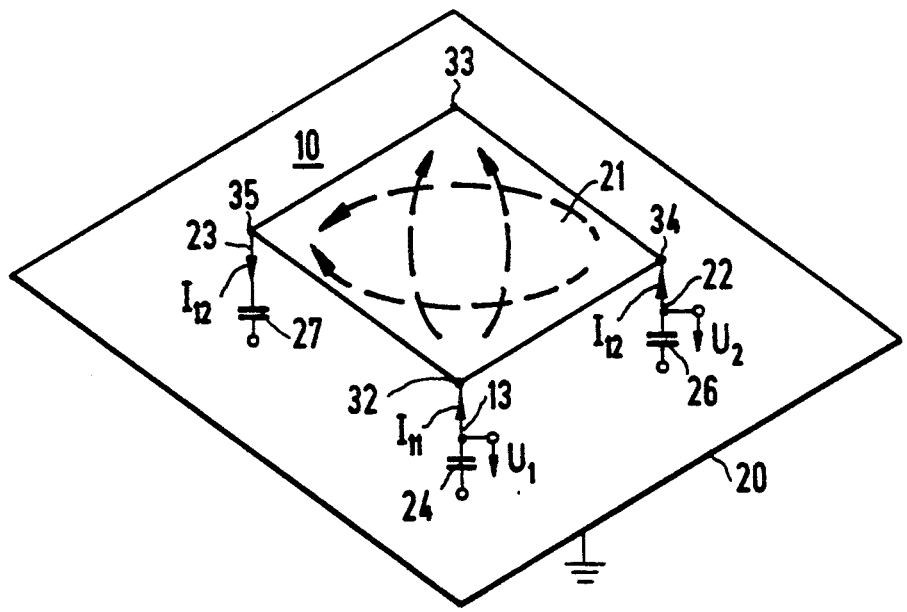
FIG. 4 is a perspective view of a resonator constructed in accordance with the principles of the present invention in an embodiment having a cover plate shared by both sub-systems.

A further embodiment of the resonator is shown in FIG. 4 having a relatively small spacing between the current network (not shown in detail) and the base plate 20, making the resonator suitable for use as a surface resonator. In this embodiment, the discrete conductors are replaced by a common cover plate 21 consisting of electrically conductive material which is disposed parallel to the base plate 20. At the junctions 32 through 35, the cover plate 21 is electrically connected to the base plate 20 via respective relatively short connecting conductors. Only the connecting conductors 13, 22 and 23 are visible in FIG. 4. These connecting conductors have respective resonance capacitances 24, 26 and 27. The current distributions of the resonant currents $I_{11}$ and $I_{12}$ arising in the cover plate 21 produce magnetic fields which are perpendicular to each other in an examination region above the cover plate 21.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a magnetic resonance imaging apparatus for diagnostic examination of an examination subject having a body axis extending in the x-axis or the y-axis of a rectangular coordinate system, and having a magnet which generates a fundamental magnetic field extending in the direction of the z-axis of the coordinate system, a region to be examined of said examination subject being disposed between pole pieces of said magnet, the improvement of a resonator comprising:

two conductor sub-systems disposed at an angle of at least 90° relative to each other and each having a resonant current flowing therein, the respective resonant currents in said sub-systems being phase-shifted by 90°, and each sub-system generating a magnetic field, the magnetic fields of said sub-systems being disposed substantially perpendicularly relative to each other in said examination region, and each sub-system containing at least one resonance capacitance;

each sub-system being formed by a current loop including a current network having junctions connected to a base plate consisting of electrically conductive material via said resonance capacitance;

said base plate forming a common return path for said current loops of said sub-systems; and and said current network of each of said sub-systems being shared by both sub-systems.

2. The improvement of claim 1 wherein said current network shared by said sub-systems consists of a plurality of discrete conductors disposed parallel to said base plate.

3. The improvement of claim 2 wherein said discrete conductors each contain a further resonance capacitance.

4. The improvement of claim 1 wherein said current network shared by said sub-systems is a cover plate consisting of electrically conductive material disposed parallel to said base plate.

* * * * *